United States Patent [19]
Arndt et al.

[11] Patent Number: 5,552,015
[45] Date of Patent: Sep. 3, 1996

[54] PROCESS FOR MANUFACTURING A PRESSURE-DIFFERENCE SENSOR

[75] Inventors: Frank Arndt; Helmut Schlaak, both of Berlin, Germany

[73] Assignee: Siemens Aktiengesellschaft, Munich, Germany

[21] Appl. No.: 256,401

[22] PCT Filed: Feb. 18, 1993

[86] PCT No.: PCT/DE93/00152

§ 371 Date: Sep. 28, 1994

§ 102(e) Date: Sep. 28, 1994

[87] PCT Pub. No.: WO93/17440

PCT Pub. Date: Sep. 2, 1993

[30] Foreign Application Priority Data

Feb. 28, 1992 [DE] Germany .................. 42 06 677.8

[51] Int. Cl.⁶ .................................................. H01L 21/306
[52] U.S. Cl. ................... 216/2; 73/721; 73/727; 73/706; 73/708; 216/51; 216/99
[58] Field of Search .................. 29/610; 73/721, 73/726, 727, 708, 706; 338/4, 42, 3; 156/655, 652, 626, 632, 636

[56] References Cited

U.S. PATENT DOCUMENTS

| | | | |
|---|---|---|---|
| 4,222,277 | 9/1980 | Kurtz et al. | 73/721 |
| 4,530,244 | 7/1985 | Starr | 73/727 |
| 4,766,666 | 8/1988 | Sugiyama et al. | |
| 4,986,127 | 1/1991 | Shimada et al. | 73/714 |
| 5,259,248 | 11/1993 | Ugai et al. | 73/721 |

*Primary Examiner*—Patrick Ryan
*Assistant Examiner*—Merrick Dixon
*Attorney, Agent, or Firm*—Kenyon & Kenyon

[57] ABSTRACT

The invention relates to a process for making an oblique-sided recess in a substrate in which areas of the surface of the substrate corresponding to the recess to be made are covered with an etching mask which is not attacked by an isotropic etching liquid, whereupon an isotropic etching is effected. In order to be able to make oblique sides of very slight slope with such a process, a layer (4) which is removable by the isotropic etching liquid is applied to the surface areas (3) of the substrate (2) before the application of the etching mask (5).

4 Claims, 2 Drawing Sheets

PROCESS FOR MANUFACTURING A PRESSURE-DIFFERENCE SENSOR

BACKGROUND OF THE INVENTION

The present invention relates to a process for manufacturing a sensor to detect a difference between two pressures having a measuring diaphragm of silicon which is clamped between two disk-shaped bearing parts of glass, with the formation in each case of an inner chamber, the one inner chamber being acted on by one of the pressures via a passage opening in the one bearing part and the other inner chamber being acted on by the other pressure of the pressure difference to be measured.

Such a process can be noted from EP 0 007 596 B1. In this known process, the measuring diaphragm which consists of silicon is produced in the manner that a silicon disk is first doped with boron on both of its sides. Layers of oxide present on the outside are partially removed by photo-etching with the formation of a mask. Thereupon, the doped regions are removed from both sides of the silicon disk by, for instance, acid etching, and the mask is thereupon also removed. The finished measuring diaphragm is then connected at its edge by bonding to, in each case, one glass disk as a bearing part; each glass disk bears a vapor-deposited layer of metal as an electrode on its inner side.

SUMMARY OF THE INVENTION

The present invention improves the known manufacturing process in such a manner to produce a pressure-difference sensor which is protected against overload solely by a suitable development of the bearing part.

To achieve this object, in a process of the aforementioned type at least the further bearing part which limits the other inner chamber is, in accordance with the present invention, provided, prior to the clamping of the silicon measuring diaphragm, with a recess having oblique sides of very slight slope, in the manner that a thin layer which can be removed by an isotropically acting etching liquid is applied to surface regions of the disk-shaped bearing part corresponding to the oblique sides to be produced. Next, the thin layer is covered with an etching mask which is not attacked by the isotropically acting etching liquid. Finally, whereupon the isotropic etching is effected.

Federal Republic of Germany 32 15 411 A1, inter alia, discloses a process for producing an oblique-sided recess in a substrate in which a layer removable by an isotropically acting etching liquid is applied to surface regions of the substrate corresponding to the recess to be produced, the removable layer is covered by an etching mask which is not attacked by an isotropically acting etching liquid, and thereupon an isotropic etching is effected, but this process is used to avoid very sharp square edges of the opening. Metal contacting paths which are conducted over sharp edges for an opening can tear.

From EP 0 394 664 A2 there is furthermore known a process for the manufacture of a silicon measuring diaphragm for a pressure sensor in which a recess having an oblique side in a trapezoidal shape is first of all etched in a silicon substrate by anisotropic etching. To impart the silicon measuring diaphragm with substantial resistance to breakage, regardless of the direction in which the pressure acts, an isotropic etching is carried out after the anisotropic etching. This isotropic etching is effected with an etching liquid of isotropic action after surface regions of the silicon disk have been covered in a manner corresponding to the recess to be produced by an etching mask which is not attacked by the isotropically acting etching liquid, for instance a mask of silicon nitride. As a result of the isotropic etching, the recess is enlarged somewhat on all sides, with rounding of its corners, with the advantage that the pressure bearing ability of the diaphragm on both sides is approximately equal.

The pressure-difference sensor of the present invention has the great advantage that, due to the development of the recess in its further bearing part, it is protected against overload without additional measures, since the semiconductor measuring diaphragm can fit snugly into the recess in the event of an overload, without danger of breaking. The pressure-difference sensor detects the pressure difference in the traditional manner. In such a case, the one bearing part is also provided with a recess in accordance with the invention. However, the pressure-difference sensor can, of course, also be used as a pressure-measuring instrument, in the manner, for instance, that a passage opening is not provided in the further bearing part and the inner chamber formed with this further bearing part and the semiconductor measuring diaphragm is evacuated or has atmospheric pressure.

In a preferred application of the process of the invention, the thin layer is made of titanium in a thickness of about 50 nm and the etching mask consists of gold. In such case, there is obtained a slope of the oblique side of about 2° to 3° in a substrate of glass when using buffered hydrofluoric acid. With silicon as a substrate, the etching liquid can, for instance, be hydrofluoric acid containing an oxidizing agent (for instance $HNO_3$).

For the production of recesses having oblique sides of different slope, the thickness of the layer and the material of which it consists is preferably developed in accordance with the desired slope of the oblique side. The flatter the slope of the oblique side, the larger the ratio must be between the of etching speed of the layer removable by the isotropically acting etching liquid and the etching speed in the substrate. The thickness of the layer is of importance for the slope of the oblique side insofar as the speed of removal is dependent essentially on the replacement of the isotropically acting etching liquid on the surface of attack of the layer. If the replacement of isotropically acting etching liquid is prevented at given regions of the surface of the substrate, a relatively slow speed of removal results. This is intentionally utilized in the present invention, since, beneath the etching mask which is not attacked by the isotropically acting etching liquid there is formed an annular pocket of increasing depth in which the isotropically acting etching liquid is relatively poorly replaced. To this extent, seen in cross section, an oblique side of relatively slight pitch is obtained below the etching mask, in which connection it is understandable, in view of the remarks made above, that the slope of the oblique side is greater the thinner the layer below the etching mask is made. The slope of the oblique side therefore can also be influenced by the thickness of this layer.

DETAILED DESCRIPTION

Figure 1:
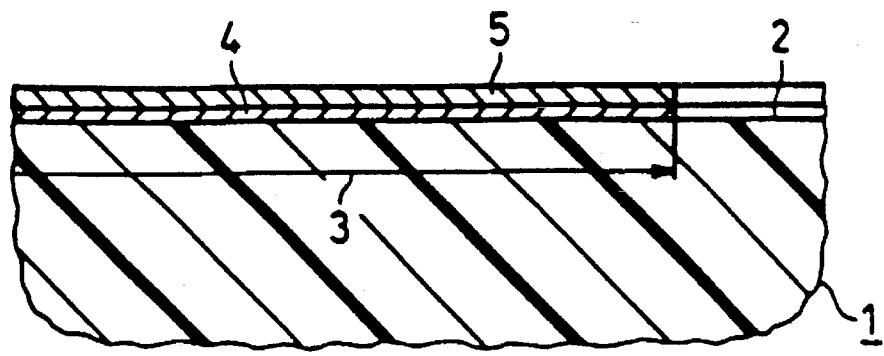
FIGS. 1A–1D show, in several views, a process for manufacture of a recess in a disk of silicon material.
Figure 1:
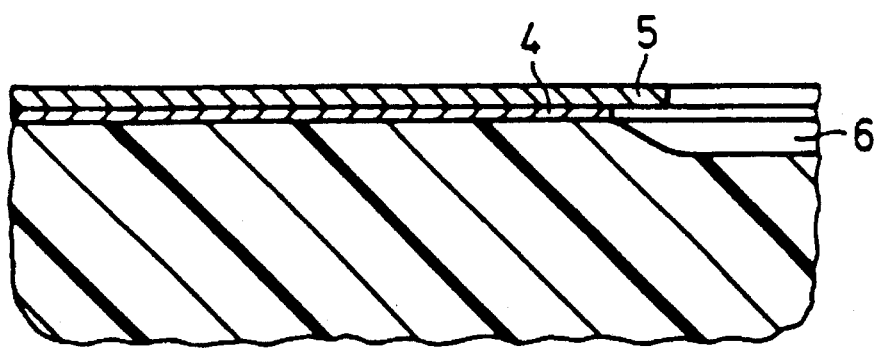
Figure 1:
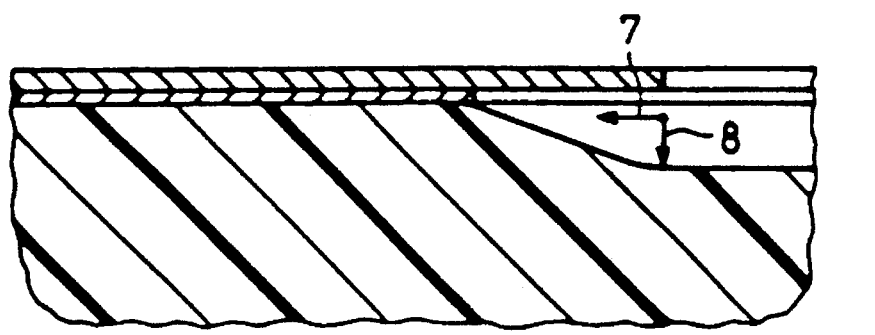
Figure 1:
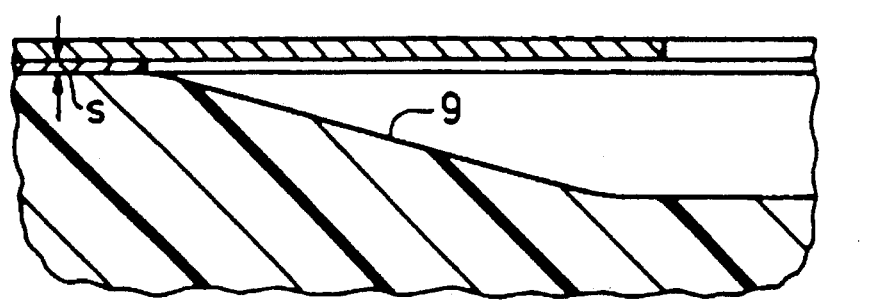

FIG. 1A shows a portion of a glass disk 1 acting as a substrate with a recess on its side 2. For this purpose, a layer 4 of a material (for instance, titanium) which is removable by an isotropically acting etching agent is applied to a region 3 of the surface of the glass disk 1; this etching agent can, for instance, be hydrofluoric acid. An etching mask 5 which is formed of a material which is resistant to the isotropically etching agent (for instance, gold) is applied to the layer 4.

If the glass disk which has been prepared in the manner described in accordance with FIG. 1A is exposed to the isotropically acting etching agent, then, with continuing attack by the isotropically acting agent, an increasingly larger recess 6 is formed, as can be noted from FIGS. 1B to 1D. In this connection, the removal in the direction of the arrow 7 is greater than in the direction of the arrow 8, since the speed of etching in the layer 4 is greater than in the glass disk 1. The slope of the oblique side 9 of the recess 6 is also dependent on the thickness s of the layer 4. The thinner the layer 4, the more the replacement of the isotropic etching agent in the region between the layer 5 and the recess 6 forming below it is impeded. Accordingly, the removal in the direction of the arrow 7 is reduced, so that the slope of the oblique side 9 becomes greater. The desired slope of the oblique side can thus be established by the thickness s of layer 4 and the material of which it is made.

Figure 2:
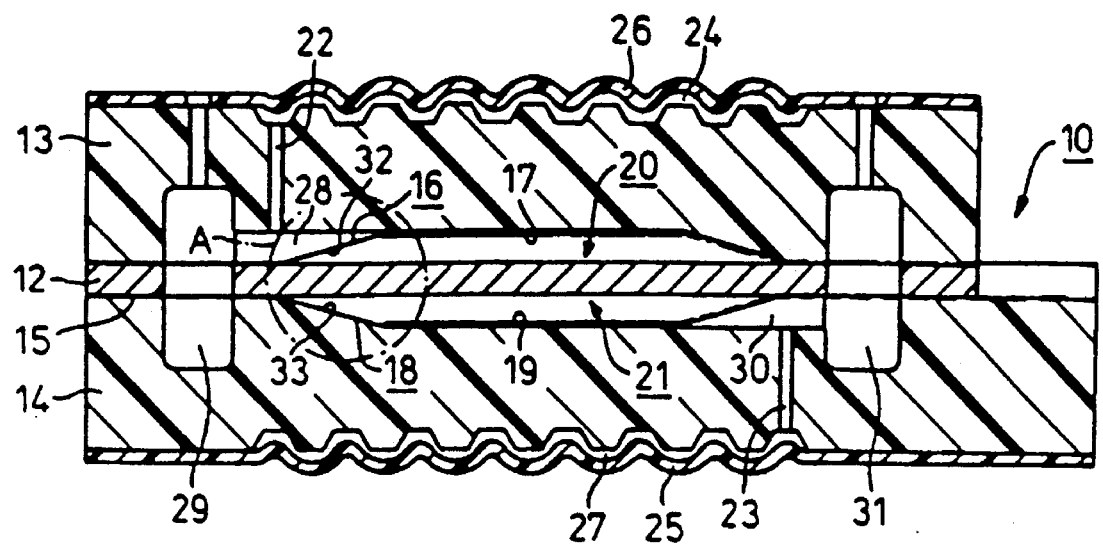
FIG. 2 is a cross section through a pressure-difference sensor made by the process of the present invention with recesses produced in bearing parts.

The pressure-difference sensor 10 shown in FIG. 2 has a silicon measuring diaphragm 12. The measuring diaphragm 12 is made of silicon and clamped between an upper bearing part 13 in FIG. 2 and a further, lower bearing part 14 in FIG. 2. Both said bearing part 13 and the further bearing part 14 consist of glass. The measuring diaphragm 12 is firmly clamped in its region 15 by bonding to the two bearing parts 13 and 14. The one bearing part 13 is isotropically so etched—as shown in FIG. 1—that a recess 16 having the cross section shown is produced and bears at its bottom a flat electrode 17. The further bearing part 14 is provided in corresponding manner, by etching, with a recess 18 which has a further flat electrode 19. Each of the recesses 16 and 18 form, together with the silicon measuring diaphragm 12, an inner chamber 20 and 21 respectively, each of which is connected via a bore hole 22 and 23 respectively in the bearing parts 13 and 14 to a prechamber 24 and 25 respectively, below separating membranes 26 and 27. Furthermore, the one inner chamber 20 is connected via a lateral channel 28 with an equalization chamber 29. In corresponding manner, the further inner chamber 21 is connected via a further lateral channel 30 with a further equalization chamber 31.

Both the recess 16 and the recess 18 have an oblique side 32 and 33 respectively, obtained by the etching-out the recesses 16 and 18 in the manner described above.

Figure 3:
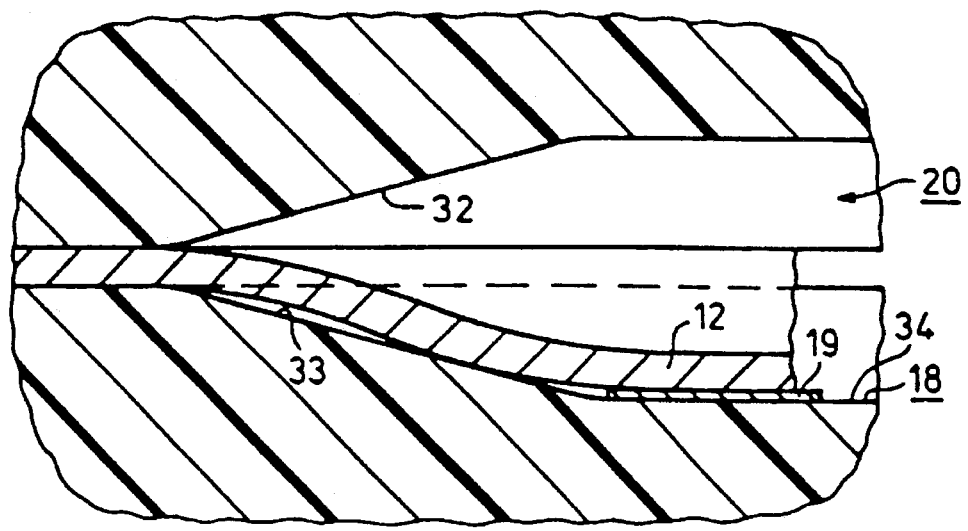
FIG. 3 shows an enlarged portion of FIG. 2.

FIG. 3 shows, on a larger scale, the portion A indicated in dash-dot line in FIG. 2. There is furthermore shown here the case that the silicon measuring diaphragm 12, as a result of overloading by an excess pressure in the inner chamber 20, is deflected to such an extent that it rests against the electrode 19 on the bottom 34 of the recess 18. Due to the oblique side 33 of relatively slight slope, the silicon measuring diaphragm 12 does not bend so greatly as to break in its deflected region; furthermore, even in the region of the oblique side 33, it rests against it. In this way, the breaking of the silicon measuring diaphragm 12 in the event of overload is prevented. Thus, a pressure-difference sensor which is created is safe against overload without further measures.

We claim:

1. A process for the manufacture of a pressure-difference sensor for detecting a difference between two pressures, having a measuring diaphragm of silicon material clamped between two disk-shaped bearing parts of glass with the formation of a separate inner chamber formed between said diaphragm and each of said disk-shaped bearing parts, in which one inner chamber can be acted on by one pressure of the two pressures to be measured via a passage opening in the one bearing part associated with said one inner chamber, and the other inner chamber can be acted on by a second pressure, comprising the steps of:

(a) prior to clamping the silicon measuring diaphragm to one or both of the disk-shaped bearing parts, limiting the inner chamber with a recess having oblique sides of very slight slope, said limiting step includes the following sub-steps:
   (i) applying a thin layer, removable by an isotropically acting etching liquid, to regions of the surface of the disk-shaped bearing part based on where the oblique sides of the inner chamber recess will be produced;
   (ii) covering the thin layer with an etching mask that is not removable by the isotropically acting etching liquid; and
   (iii) effecting isotropic etching thereupon.

2. The process of claim 1, wherein, said thin layer consists of titanium in a thickness of about 50 nm, and said etching mask is formed of gold.

3. The process of claim 1, wherein, a thickness of said thin layer and the material of which it is made are selected to achieve the desired slope of the oblique side of the inner chamber recess.

4. The process of claim 3 wherein said etching mask is formed of gold.

* * * * *